United States Patent
Liu et al.

(10) Patent No.: US 8,900,367 B2
(45) Date of Patent: Dec. 2, 2014

(54) APPARATUS AND METHOD FOR MANUFACTURING LARGE-AREA CARBON NANOTUBE FILMS

(75) Inventors: Chang-Hong Liu, Beijing (CN); Shou-Shan Fan, Beijing (CN)

(73) Assignees: Tsinghua University, Beijing (CN); Hon Hai Precision Industry Co., Ltd., New Taipei (TW)

(*) Notice: Subject to any disclaimer, the term of this patent is extended or adjusted under 35 U.S.C. 154(b) by 2217 days.

(21) Appl. No.: 11/608,612

(22) Filed: Dec. 8, 2006

(65) Prior Publication Data

US 2007/0292614 A1    Dec. 20, 2007

(30) Foreign Application Priority Data

Jun. 16, 2006 (TW) ................ 95121708 A
Jun. 21, 2006 (CN) ............ 2006 1 0061239

(51) Int. Cl.
*C23C 16/00* (2006.01)
*C23C 16/26* (2006.01)

(52) U.S. Cl.
CPC .................... *C23C 16/26* (2013.01)
USPC ....................................... 118/728

(58) Field of Classification Search
USPC ................................. 118/728, 729
See application file for complete search history.

(56) References Cited

U.S. PATENT DOCUMENTS

| | | |
|---|---|---|
| 7,033,650 B2 | 4/2006 | Mauthner et al. |
| 2004/0151835 A1* | 8/2004 | Croci et al. ............... 427/249.1 |
| 2004/0157058 A1 | 8/2004 | Veerasamy et al. |

FOREIGN PATENT DOCUMENTS

| | | |
|---|---|---|
| CN | 1570220 | 1/2005 |
| CN | 1724343 A | 1/2006 |
| JP | 62149870 A * | 7/1987 |
| JP | 2002-246375 | 8/2002 |

OTHER PUBLICATIONS

Definition of "Helix." Obtained from Dictionary.com on Jun. 5, 2013.*
Definition of "Spiral." Obtained from Dictionary.com on Jun. 5, 2013.*
Definition of "Screw." Obtained from Dictionary.com on Jun. 5, 2013.*

* cited by examiner

*Primary Examiner* — Maureen Gramaglia
(74) *Attorney, Agent, or Firm* — Novak Druce Connolly Bove + Quigg LLP

(57) ABSTRACT

An apparatus for manufacturing a large-area carbon nanotube film is provided. The apparatus includes a reactor chamber, a substrate having a curved, three-dimensional surface and a supporter received in the reactor chamber. The curved, three-dimensional curve surface of the substrate is provided for growing the carbon nanotube film thereon. The supporter is provided for fixing the substrate in the reactor chamber. The present invention also provides a method for manufacturing a large-area carbon nanotube film employing this apparatus.

11 Claims, 3 Drawing Sheets

APPARATUS AND METHOD FOR MANUFACTURING LARGE-AREA CARBON NANOTUBE FILMS

BACKGROUND OF THE INVENTION

1. Field of the Invention

The present invention relates generally to technologies for manufacturing carbon nanotubes and, more particularly, to an apparatus and method for manufacturing large-area carbon nanotubes films.

2. Description of Related Art

Carbon nanotubes are very small tube-shaped structures essentially having the composition of a graphite sheet, formed as a tube. Carbon nanotubes produced by arc discharge between graphite rods were first discovered and reported in an article by Sumio Iijima, entitled "Helical Microtubules of Graphitic Carbon" (Nature, Vol. 354, Nov. 7, 1991, pp. 56-58).

A carbon nanotube film is generally composed of a number of carbon nanotubes. In the carbon nanotube film, each carbon nanotube is perpendicular to a surface of the carbon nanotube film along its axis direction. Carbon nanotube films are electrically conductive and thermally conductive along the axes direction of the carbon nanotubes, are chemically stable, have electromagnetism shield function and so on. Due to these and other properties, it has been suggested that carbon nanotube films can play an important role in fields such as microscopic electronics, materials science, biology and chemistry.

With the development of science and technology, large-area carbon nanotube films are more and more needed. At the present, carbon nanotube films are generally made on a base using a chemical vapor deposition (CVD) method. However, a reactor chamber for growing carbon nanotube film generally has a limited dimension, and, therefore, the dimension of the produced carbon nanotube films may be limited by the reactor chamber.

Therefore, an apparatus and method for manufacturing large-area carbon nanotube films are desired.

SUMMARY OF THE INVENTION

An apparatus for manufacturing a large-area carbon nanotube film is provided. The apparatus includes a reactor chamber, a substrate having a curved, three-dimensional surface and a supporter received in the reactor chamber. The curved, three-dimensional surface of the substrate is provided for growing the carbon nanotube film thereon. The supporter is provided for fixing the substrate in the reactor chamber.

A method for manufacturing a carbon nanotube film is provided. The method includes the steps of: providing a substrate having a smoothly curved surface configured for growing a carbon nanotube film thereon; fixing the substrate in a reactor chamber; forming a catalyst layer on the smoothly curved surface of the substrate; and growing a carbon nanotube film on the curved surface of the substrate by a chemical vapor deposition process.

Advantages and novel features will become more apparent from the following detailed description when taken in conjunction with the accompanying drawings.

BRIEF DESCRIPTION OF THE DRAWINGS

Many aspects of the present apparatus and method can be better understood with reference to the following drawings. The components in the drawings are not necessarily drawn to scale, the emphasis instead being placed upon clearly illustrating the principles of the present apparatus and method. Moreover, in the drawings, like reference numerals designate corresponding parts throughout the several views.

DETAILED DESCRIPTION OF THE INVENTION

Reference will now be made to the drawings to describe the preferred embodiments of the present apparatus for manufacturing large-area carbon nanotube films, in detail.

Figure 1:
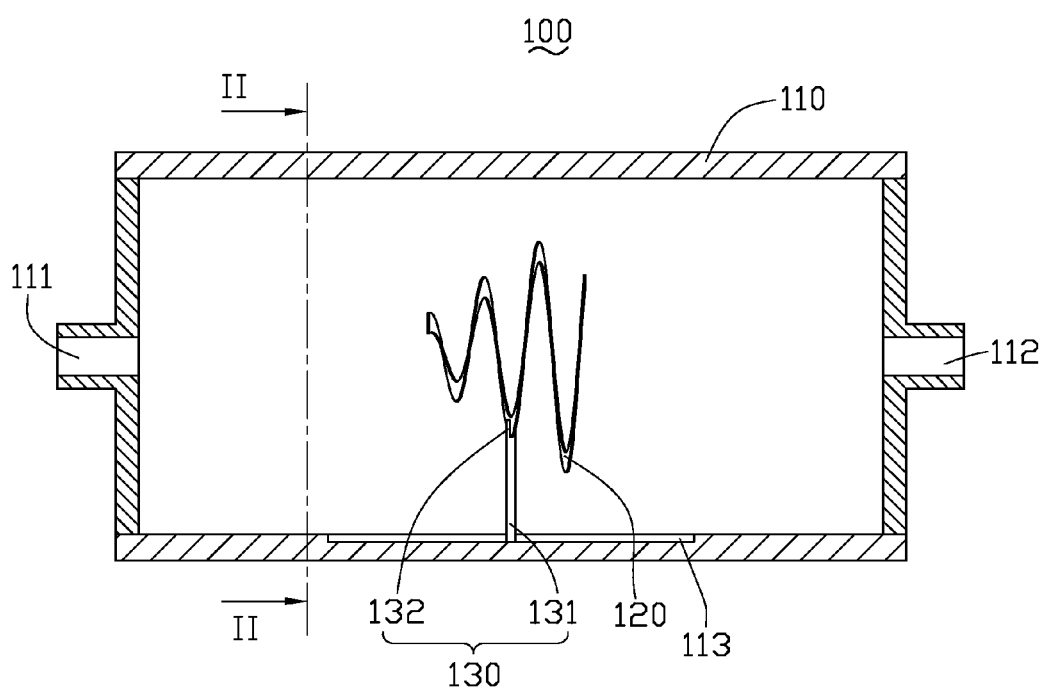
FIG. 1 is a schematic view of an apparatus for manufacturing large-area carbon nanotube film, in accordance with a first embodiment.

Referring to FIG. 1, an apparatus 100 for manufacturing a large-area carbon nanotube film, in accordance with a first embodiment, is illustrated. The apparatus 100 mainly includes a reactor chamber 110, a substrate 120 having a smoothly curved surface and a supporter 130. The smoothly curved surface of the substrate 120 is provided for growing a carbon nanotube film thereon. The supporter 130 is used to fix the substrate 120 in the reactor chamber 110.

The reactor chamber 110 receives the substrate 120 and the supporter 130 therein. The reactor chamber 110 has an inlet 111 and an outlet 112. The inlet 111 is configured for introducing a carbon-containing gas into the reactor chamber 110, thus producing (i.e., acting as a source of) carbon atoms for growing the carbon nanotube film (not shown). The outlet 112 is configured for allowing an exhaust gas to be evacuated/discharged therefrom. Preferably, the inlet 111 and the outlet 112 are located at opposite sidewalls of the reactor chamber 110, and the carbon-containing gas can flow from the inlet 111 to the outlet 112 along a direct path, and thus the exhaust gas can be discharged timely.

The reactor chamber 110 may have an circular, elliptic, triangular, rectangular, other regular polygonal or irregular polygonal profile in view of a cross section along line II-II of the reactor chamber 110. The reactor chamber 110 may, usefully, be made of a material with a high temperature resistance and chemically stable performance. For example, the reactor chamber 110 may, advantageously, be made of quartz, ceramic, stainless steel or the like. In the present embodiment, the reactor chamber 110 is a tube, and has a circular cross section.

The reactor chamber 110 generally has a predetermined dimension. As such, if the substrate 120 to be received in the reactor chamber 110 is curved, the reactor chamber 110 can hold a larger-area substrate 120 for growing the carbon nanotube film. This increase in surface area for the substrate 120 can, in part, be maximized by using a substrate with a three-dimensional curvature, such as a spiral/helix (as per FIGS. 1 and 2) or a tube (FIG. 3). Thus, in a preferred embodiment, the substrate 120 is curved and configured for growing the carbon nanotube film thereon. The curved substrate 120 may, advantageously, be a cylinder structure or a helical structure. By employing a smooth curvature within the substrate 120, with no sharp corners, converting a three-dimensional shape (e.g., the carbon nanotube film) to an essential two-dimensional shape becomes easier to achieve (i.e., reduced opportunity for breakage of the film).

Figure 2:
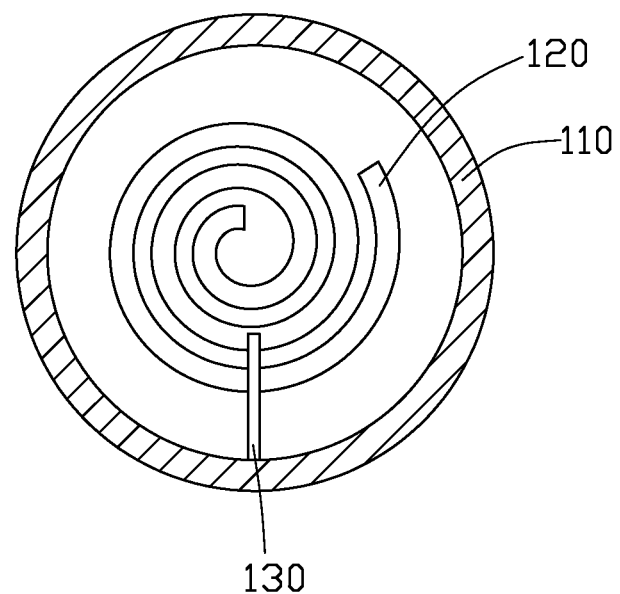
FIG. 2 is a schematic, cross-sectional view along line II-II of a helical-shaped substrate of the apparatus of FIG. 1.
Figure 3:
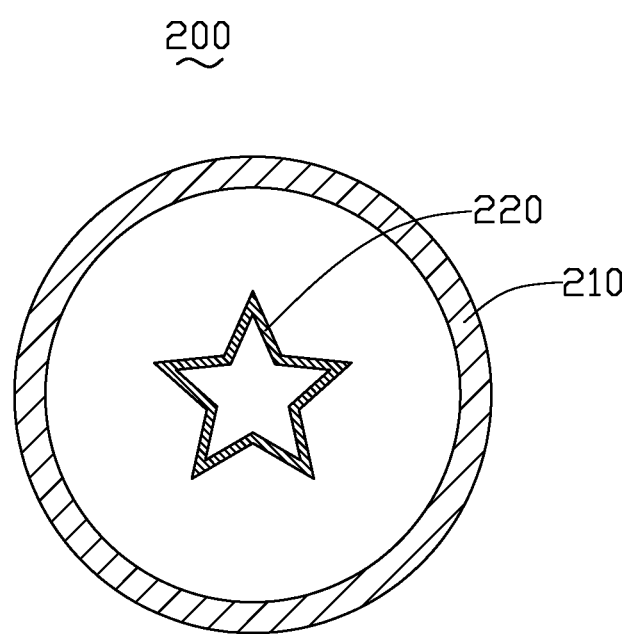
FIG. 3 is a schematic, cross-sectional view a cylinder-shaped substrate of an apparatus for manufacturing large-area carbon nanotube film, in accordance with a second embodiment.

Referring to FIG. 2, in the present embodiment, the curved substrate 120 is configured to be helical shape in the tube-shaped reactor chamber 110. In detail, the helical-shaped substrate 120 is formed through twisting a long strip substrate sheet. The helical-shaped substrate 120 may be arranged inside the reactor chamber 110 along a radial direction of the reactor chamber 110, along an axis direction of the reactor chamber, or at an angle to the axis of the tubular reactor chamber 110. In the present embodiment, the helical-shaped substrate 120 and the tubular reactor chamber 110 are coaxially aligned, that is, an axis of the helical-shaped substrate 120 parallel with that of the tubular reactor chamber 110. The helical-shaped substrate 120 may, e.g., be made of a porous material, such as silicon dioxide ($SiO_2$), aluminum oxide ($Al_2O_3$) or the like. Also, the helical-shaped substrate 120 may, e.g., be made of metal materials, for example, stainless steel, nickel (Ni) and so on. In the present embodiment, the helical substrate 120, advantageously, is made of porous $Al_2O_3$.

The supporter 130 is configured for supporting and fixing the helical substrate 120. The supporter 130 has a first end 131 and an opposite second end 132. The supporter 130 may be fixed wholly inside the reactor chamber 110. For example, the first end 131 is connected with the reactor chamber 110, and therefore the second end 132 freely locates inside the reactor chamber 110 to support the helical-shaped substrate 120. The first end 131 may be movably fixed on an inner wall of the reactor chamber 110. For example, a groove 113 is defined in the inner wall of the reactor chamber 110, and the first end 131 is arranged in the groove 113 and can move freely in the groove 113. As the first end 131 reaches a predetermined position of the groove 113, a suitable fixture (not shown), such as a bolt, may be provided to fix the first end 131. As such, a location of the helical-shaped substrate 120 in the reactor chamber 110 can be controlled via adjusting the first end 131 of the supporter 130.

Alternatively, the supporter 130 may be fixed partly inside the reactor chamber 110. For example, the first end 131 is fixed outside of the reactor chamber 110, and the wall of the reactor chamber 110 defines a through hole. The second end 132 locates freely inside the reactor chamber 110 through the through hole to support the helical-shaped substrate 120.

Referring to FIG. 3, an apparatus 200 for manufacturing a carbon nanotube film, in accordance with a second embodiment, is illustrated. The apparatus 200 has a similar structure with the apparatus 100 of the first embodiment except for the substrate 220 for growing carbon nanotube film. The apparatus 200 includes a reactor chamber 210, the substrate 220 and a supporter (not shown). The reactor chamber 210 has a same structure and made of a same material as the reactor chamber 110 of the first embodiment. Similarly, the supporter has a same structure and made of a same material as the supporter 130 of the first embodiment. The substrate 220 is configured to be a tubular shape (not necessarily cylindrical) and positioned in the reactor chamber 210. In detail, the tube-shaped substrate 220 may be formed through curving a large-area substrate sheet. Further, the free, mating edges of the tube-shaped substrate 220 may or may not be sealed after the substrate sheet is curved. As such, the present tube-shaped substrate 220 is not necessarily an absolute tube, but is a sealed or unsealed tube. In order to easily describe the shape of the substrate 210, both of the above two types of the tube (sealed tube and unsealed tube) are considered to be a tube in the following description.

The tube-shaped substrate 220 may have, for example, a circular, elliptic, triangular, rectangular, other regular polygonal or irregular polygonal cross-section. Exactly, the cross-sectional profile of the tube-shaped substrate 220, as shown, is unsealed. In the present embodiment, the tube-shaped substrate 220 has an unsealed pentagram (i.e., star) profile in view of a cross section of the tube-shaped substrate 220, and is made of nickel. The tube-shaped substrate 220 and the reactor chamber 210 are coaxially aligned, that is, the axis of the tube-shaped substrate 220 parallel with that of the reactor chamber 210. While there is an advantage to having no sharp corners, the presence of sharp corners can permit a more complex geometrical shape (e.g., the star shape of the substrate 220) and thereby potentially allow a substrate 220 with a greater surface area per volume to be formed. The greater the surface area of the substrate 220, the larger the effective film size that can be generated within a particular reactor chamber 210.

Except the above first and second embodiments, the substrates 120 and 220 may have a wave shape, zigzag shape, conical shape, a meandering shape or other not flat surface structure. In addition, in the above embodiments, each substrate advantageously has at least one smooth, continuous surface section for growing carbon nanotube film thereon, even if corners do exist between adjoining sections.

Taking the apparatus 100 in accordance with the first embodiment as an example, a method for fabricating a large-area carbon nanotube film will be described in the following. In a general first step, a catalyst film is formed on at least a surface of the helical-shaped substrate 120. The catalyst film may, advantageously, be made of iron (Fe), nickel (Ni), cobalt (Co), or any alloy thereof. The catalyst film may, usefully, be formed on at least one surface of the helical-shaped substrate 120 by evaporation deposition, ion plating or sputtering deposition method. In the present embodiment, an iron catalyst film, about five nanometers thick, is formed on one side surface of the helical-shaped substrate 120 by electron beam evaporation. The helical-shaped substrate 120 having the iron catalyst film is then annealed in air at 300° C. overnight. This annealing step oxidizes the surface of the helical-shaped substrate 120 and the iron catalyst film to form a thin oxide layer. In the case of porous helical-shaped substrate 120 (the helical-shaped substrate 120 is made of $Al_2O_3$), the resulting thin oxide layer can protect its porous structure from collapsing later in the high-temperature CVD (Chemical Vapor Deposition) process.

In a general second step, the helical-shaped substrate 120 having the iron catalyst film is fixed in the reactor chamber 110 via the supporter 130. The helical-shaped substrate 120 and the reactor chamber 110 are coaxially aligned. In the reacting process, the carbon-containing gas can flow from the inlet 111 to the outlet 112 along a direct path and can retain a relatively stable speed, for the carbon-containing gas not being blocked or interrupted by the helical-shaped substrate 120. Thus, a uniform and high-ordered carbon nanotube film can be grown on the helical-shaped substrate 120. The ordered carbon nanotube film is a continuous carbon nanotubes array, which continuously grow and perpendicular to the surface of the helical-shaped substrate 120 along the length of the carbon nanotube.

Finally, the reactor chamber 110 is heated to 700° C. in flowing an inert gas (e.g., argon, nitrogen) in the reactor chamber 110. For example, the inert gas is introduced into the inlet 111 and is discharged from the outlet 112. Then the carbon-containing gas (e.g., ethylene, methane, ethane, propane) is flown at about 1000 sccm (Standard Cubic Centimeters Minute) for 15 minutes to 60 minutes, approximately, after which the reactor chamber 110 is cooled to room temperature, and thus, a large-area high ordered carbon nanotube film is formed on the surface of the helical-shaped substrate 120. A desired thickness of the ordered carbon nanotube film can be controlled by controlling the growth of the array of carbon nanotube of the ordered carbon nanotube film. For example, the thickness of the ordered carbon nanotube film can be roughly controlled, advantageously, be controlling a growth time, or other known growth factors (e.g., temperature, gas concentration, catalyst characteristics) may conjunctively or alternatively be regulated.

Alternatively, in the above-described embodiment, the reactor chamber 110 can be pumped up to a certain vacuum degree. A working gas, such as a mixture of the inert gas and the carbon-containing gas with a predetermined mixing proportion and a predetermined flowing speed is then continuously introduced into the evacuated reactor chamber 110 from the inlet 111, and is discharged from the outlet 112 continuously. As such, the working gas can retain a flowing state in the carbon nanotube film growing process, and as thus, the carbon-containing gas in the working gas can maintain its original concentration. As a result, a large-area high quality carbon nanotube film, such as a high uniform thickness and high ordered carbon nanotube film, can be created.

As above described, for a reactor chamber with a limited dimension, the substrate for growing carbon nanotube film is configured to be a curved, three-dimensional shape (i.e., not a flat shape, two-dimensional shape), and thus the limited dimension reactor chamber can hold a large-area substrate. Therefore, a corresponding large-area carbon nanotube film can be grown. It is to be understood a curved shape, in the context of the present apparatus, may be continuously smooth or may include distinct corners (i.e., abrupt curvature).

It is believed that the present embodiment and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An apparatus for manufacturing a large-area carbon nanotube film, said apparatus comprising:
   a reactor chamber comprising an inlet and an outlet located at opposite sidewalls of the reactor chamber;
   a helical-shaped substrate being configured for growing the carbon nanotube film thereon, wherein the inlet and the outlet are located on the axis of the helical-shaped substrate, and the radius of the helical-shaped substrate gradually increases along the axis of the helical-shaped substrate; and
   a supporter fixing the helical-shaped substrate in the reactor chamber, wherein the supporter is perpendicular to the axis of the helical-shaped substrate.

2. The apparatus as claimed in claim 1, wherein the helical-shaped substrate and the reactor chamber are coaxially arranged.

3. The apparatus as claimed in claim 1, wherein the reactor chamber has a tube shape.

4. The apparatus as claimed in claim 1, wherein a carbon-containing gas flows from the inlet to the outlet along a direct path in operation.

5. The apparatus as claimed in claim 1, wherein the helical-shaped substrate is formed through twisting a long strip substrate sheet.

6. The apparatus as claimed in claim 1, wherein the inlet and the outlet are located on an axis direction of the reactor chamber.

7. The apparatus as claimed in claim 1, wherein the supporter has a first end fixed to an interior of the reactor chamber, and a second end fixed to an interior of the helical-shaped substrate away from the ends of the helical-shaped substrate.

8. An apparatus for manufacturing a large-area carbon nanotube film, said apparatus comprising:
   a reactor chamber comprising an inlet and an outlet located at opposite sidewalls of the reactor chamber configured for flowing a carbon-containing gas from the inlet to the outlet along a direct path in operation; and
   a helical-shaped substrate having a smoothly curved surface configured for growing the carbon nanotube film thereon, wherein the radius of the helical-shaped substrate gradually increases along a flow direction of the carbon-containing gas; and
   a supporter fixing the helical-shaped substrate in the reactor chamber, wherein the supporter is perpendicular to the axis of the helical-shaped substrate.

9. The apparatus as claimed in claim 8, wherein the supporter includes a first end and a second end, the first end is movably fixed on an inner wall of the reactor chamber, and the second end freely locates inside the reactor chamber to support the helical-shaped substrate.

10. The apparatus as claimed in claim 9, wherein the inner wall of the reactor chamber defines a groove, and the first end is movably fixed in the groove.

11. The apparatus as claimed in claim 8, wherein the supporter has a first end fixed to an interior of the reactor chamber, and a second end fixed to an interior of the helical-shaped substrate away from the ends of the helical-shaped substrate.

\* \* \* \* \*